United States Patent
Kashiwagi et al.

(10) Patent No.: US 7,858,198 B2
(45) Date of Patent: *Dec. 28, 2010

(54) PHOSPHOR-CONTAINING ADHESIVE SILICONE COMPOSITION, COMPOSITION SHEET FORMED OF THE COMPOSITION, AND METHOD OF PRODUCING LIGHT EMITTING DEVICE USING THE SHEET

(75) Inventors: Tsutomu Kashiwagi, Annaka (JP); Toshio Shiobara, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 400 days.

This patent is subject to a terminal disclaimer.

(21) Appl. No.: 12/078,909

(22) Filed: Apr. 8, 2008

(65) Prior Publication Data

US 2008/0308828 A1    Dec. 18, 2008

(30) Foreign Application Priority Data

Apr. 10, 2007   (JP)   ............................. 2007-103236
Mar. 6, 2008    (JP)   ............................. 2008-056897

(51) Int. Cl.
*B32B 9/04*      (2006.01)
*C08L 83/04*     (2006.01)

(52) U.S. Cl. ....................... 428/447; 525/477; 525/478; 524/400; 524/403; 524/404; 524/413; 524/429; 524/431; 524/588; 528/15; 528/31; 528/32; 528/42; 427/58; 427/387

(58) Field of Classification Search ....................... None
See application file for complete search history.

(56) References Cited

U.S. PATENT DOCUMENTS

| | | | | |
|---|---|---|---|---|
| 3,840,393 A | * | 10/1974 | Ishizaka et al. | 427/208.4 |
| 4,830,893 A | * | 5/1989 | Nakamura et al. | 428/35.8 |
| 5,258,433 A | * | 11/1993 | Meier et al. | 524/155 |
| 5,705,588 A | * | 1/1998 | Kreis et al. | 528/24 |
| 7,705,104 B2 | * | 4/2010 | Yamakawa et al. | 528/31 |
| 2004/0094757 A1 | | 5/2004 | Braune et al. | |
| 2004/0214966 A1 | | 10/2004 | Tabei et al. | |
| 2005/0280017 A1 | | 12/2005 | Oshio et al. | |
| 2009/0105395 A1 | * | 4/2009 | Kamata et al. | 524/502 |

FOREIGN PATENT DOCUMENTS

| | | | |
|---|---|---|---|
| EP | 568 318 | * | 11/1993 |
| EP | 1780235 A2 | | 5/2007 |
| EP | 1780242 A2 | | 5/2007 |
| EP | 1873211 A1 | | 1/2008 |
| WO | WO 2007/125785 | * | 11/2007 |

* cited by examiner

*Primary Examiner*—Marc S Zimmer
(74) *Attorney, Agent, or Firm*—Birch, Stewart, Kolasch & Birch, LLP (57) ABSTRACT

An addition curable adhesive silicone composition containing a phosphor dispersed uniformly therein is provided. The dispersive state of the phosphor remains stable over time. The composition, in an uncured state at room temperature, is either a solid or a semisolid, and is therefore easy to handle, and is suited to an adhesive silicone composition sheet which is able to be formed easily on an LED chip using a conventional assembly apparatus.

7 Claims, 1 Drawing Sheet

Fig. 1

PHOSPHOR-CONTAINING ADHESIVE SILICONE COMPOSITION, COMPOSITION SHEET FORMED OF THE COMPOSITION, AND METHOD OF PRODUCING LIGHT EMITTING DEVICE USING THE SHEET

BACKGROUND OF THE INVENTION

1. Field of the Invention

The present invention relates to an addition curable phosphor-containing adhesive silicone composition, which in an uncured state (namely, prior to heat treatment) at room temperature is either a solid or a semisolid, and which by positioning on, and bonding to, the surface of an LED chip, is capable of converting the blue light or ultraviolet light of the LED. The present invention also relates to a sheet formed of the composition, a sheet-like cured product obtained by heat-curing the sheet, a method of producing a light emitting device that uses the silicone composition sheet, and a light emitting device.

2. Description of the Prior Art

In the field of light emitting diodes (LED), the use of phosphors for wavelength conversion is well known (see patent reference 1). Because silicone resins exhibit excellent light resistance, they are attracting considerable attention as coating materials for encapsulating and protecting LED chips (see patent reference 2).

In white LEDs, a method is generally used in which a silicone resin or epoxy resin with a phosphor dispersed therein is used to coat the LED chip, thereby dispersing the phosphor in a position close to the chip and enabling the blue light from the LED to be converted to a pseudo white light. However, if the dispersion of the phosphor within the resin lacks uniformity or is biased, then color shift becomes more likely, meaning that the phosphor must be dispersed uniformly within the coating resin layer in order to generate a uniform white light. In order to achieve such uniform dispersion, screen printing methods and phosphor precipitation methods are under investigation, but these methods suffer from other problems, including a more complex production process and inadequate stability. Accordingly, a simple technique that enables a phosphor to be dispersed uniformly across a chip surface has been keenly sought.

Furthermore, in LEDs and the like, the resin layer used to coat the LED chip requires high levels of heat resistance and ultraviolet light resistance. Moreover, a resin layer that can be produced using conventional production apparatus would be ideal.

[Patent Reference 1] US 2004/0094757 A1
[Patent Reference 2] US 2004/0214966 A1

SUMMARY OF THE INVENTION

An object of the present invention is to provide an addition curable adhesive silicone composition, which contains a phosphor dispersed uniformly therein, the dispersive state of which remains stable over time, and which in an uncured state at room temperature is either a solid or a semisolid, and is therefore easy to handle, and also to provide an adhesive silicone composition sheet that is formed of the composition and is able to formed easily on the surface of an LED chip using a conventional assembly apparatus. Furthermore, another object of the present invention is to provide a method of producing an LED light emitting device, which uses the above sheet to coat the surface of an LED chip with a phosphor-containing cured silicone resin layer.

A first aspect of the present invention provides an addition curable adhesive silicone resin composition that is a solid or semisolid at room temperature, comprising:

(A) an organopolysiloxane having a resin structure composed of $R^1SiO_{1.5}$ units, $R^2_2SiO$ units and $R_a^3R_b^4SiO_{(4-a-b)/2}$ units (wherein, $R^1$, $R^2$ and $R^3$ each represent, independently, a hydroxyl group, methyl group, ethyl group, propyl group, cyclohexyl group or phenyl group, each $R^4$ represents, independently, a vinyl group or allyl group, a represents 0, 1 or 2, and b represents 1 or 2, provided that a+b is 2 or 3), in which at least a portion of the $R^2_2SiO$ units are connected in a continuous repeating sequence, and the number of units in the repeating sequence is within a range from 5 to 50, (B) an organohydrogenpolysiloxane having a resin structure composed of $R^1SiO_{1.5}$ units, $R^2_2SiO$ units and $R_c^3H_d SiO_{(4-c-d)/2}$ units (wherein, $R^1$, $R^2$ and $R^3$ are as defined above, c represents 0, 1 or 2, and d represents 1 or 2, provided that c+d is 2 or 3), in which at least a portion of the $R^2_2SiO$ units are connected in a continuous repeating sequence, and the number of units in the repeating sequence is within a range from 5 to 50, the organohydrogenpolysiloxane provided in sufficient quantity that the molar ratio of hydrogen atoms bonded to silicon atoms within the component (B) relative to a combined total of vinyl groups and allyl groups within the component (A) is within a range from 0.1 to 4.0, (C) an effective curing quantity of a platinum group metal-based catalyst, and (D) a phosphor.

In the above adhesive silicone composition, compositions in which either one of, or both, the component (A) and the component (B) contain a silanol group exhibit more favorable adhesion for the composition, and are consequently preferred.

A second aspect of the present invention provides an adhesive silicone composition sheet prepared by molding the above addition curable silicone composition into a sheet-like form.

A sheet-like cured product obtained by curing the silicone composition is a hard resin, and yet still exhibits excellent flexibility and minimal surface tack, and is also able to be readily molded with conventional molding apparatus.

The layer-like cured product exhibits significant advantages including a high degree of transparency, uniform dispersion of the phosphor within the cured product, and a high level of stability of the dispersive state of the phosphor, and is therefore useful as an encapsulating body or coating formed on the surface of an LED chip.

A fourth aspect of the present invention provides a method of producing a light emitting device having a coated LED chip, the method comprising: positioning the above adhesive silicone composition sheet on the surface of an LED chip, and heat-curing the composition sheet, thereby coating the surface of the LED chip with a phosphor-containing cured silicone resin layer.

In this aspect of the invention, the composition sheet is positioned on the surface of the LED chip, so that at least the surface of the LED chip is covered with a cured silicone resin layer. The composition sheet may also be positioned so as to cover not only the surface of the semiconductor chip, but the entire surface of the LED element device containing the semiconductor chip, so that the entire device is covered with the cured resin layer.

A fifth aspect of the present invention provides a light emitting device having a coated LED chip that is obtained using the above production method.

An adhesive silicone composition of the present invention and a composition sheet formed therefrom are solid or semisolid in an uncured state at room temperature, and are therefore easy to handle and exhibit favorable workability. As a result, the composition sheet can be easily positioned on, and bonded to, the surface of an LED chip. Furthermore, because the composition or composition sheet is a solid or semisolid in an uncured state, the phosphor contained therein does not suffer from separation or precipitation during storage of the composition or composition sheet. Moreover, the silicone composition sheet can be easily positioned on, and bonded to, the surface of an LED chip using a typical mounting device such as a die-bond mounter. By subsequently curing the bonded composition sheet, a cured resin layer with the phosphor dispersed uniformly therein can be formed efficiently and stably at a uniform layer thickness. Accordingly, the method of producing an LED light emitting device according to the present invention exhibits excellent suitability to mass production-Furthermore, because the phosphor is dispersed uniformly within the resulting phosphor-containing silicone resin layer, color shift is unlikely, and the degree of yellowing is minimal. Moreover, although the silicone resin layer is a hard resin, it still exhibits excellent flexibility and minimal surface tack.

DETAILED DESCRIPTION OF THE PREFERRED EMBODIMENTS

A more detailed description of the present invention is provided below. In the following description, "room temperature" refers to a temperature within a range from 15 to 30° C.

[Addition Curable Adhesive Silicone Composition]

—(A) Organopolysiloxane Having Resin Structure—

The organopolysiloxane having a resin structure (namely, a three dimensional network-type structure) of the component (A), which represents one of the important components of the composition of the present invention, is composed of $R^1SiO_{1.5}$ units, $R^2_2SiO$ units and $R_a^3R_b^4SiO_{(4-a-b)/2}$ units (wherein, $R^1$, $R^2$ and $R^3$ each represent, independently, a hydroxyl group, methyl group, ethyl group, propyl group, cyclohexyl group or phenyl group, each $R^4$ represents, independently, a vinyl group or allyl group, a represents 0, 1 or 2, and b represents 1 or 2, provided that a+b is 2 or 3), and includes a partial structure in which at least a portion of the $R^2_2SiO$ units are connected in a continuous repeating sequence, wherein the number of units in the repeating sequence is within a range from 5 to 50, preferably from 8 to 30, and even more preferably from 10 to 20.

The partial structure in which at least a portion of the $R^2_2SiO$ units are connected in a continuous repeating sequence, and in which the number of units in the repeating sequence is within a range from 5 to 50, refers to a straight-chain diorganopolysiloxane chain structure represented by a general formula (1) shown below.

(1)

(wherein, m represents an integer from 5 to 50)

In the organopolysiloxane of the component (A), at least a portion of the $R^2_2SiO$ units, and preferably 50 mol % or greater (namely, 50 to 100 mol %) and even more preferably 80 mol % or greater (namely, 80 to 100 mol %) of the $R^2_2SiO$ units form a chain structure represented by the general formula (1) within the organopolysiloxane molecule.

In a molecule of the component (A), the presence of the $R^2_2SiO$ units causes the polymer molecule to extend in a straight-chain type structure, whereas the $R^1SiO_{1.5}$ units cause branching of the polymer molecule, or the formation of a three dimensional network structure. The $R^4$ groups (which each represent, independently, a vinyl group or allyl group) within the $R_a^3R_b^4SiO_{(4-a-b)/2}$ units perform the role of curing the composition of the present invention by undergoing a hydrosilylation addition reaction with the hydrogen atoms bonded to silicon atoms (namely, SiH groups) of the $R_c^3H_dSiO_{(4-c-d)/2}$ units within the component (B) described below.

The molar ratio between the three essential siloxane units that constitute the component (A), namely the molar ratio of $R^1SiO_{1.5}$ units:$R^2_2SiO$ units $R_a^3R_b^4SiO_{(4-a-b)/2}$ units is preferably within a range from 90 to 24:75 to 9:50 to 1, and is even more preferably within a range from 70 to 28:70 to 20:10 to 2 (provided the total is 100), as such a ratio yields more favorable properties for the resulting cured product.

The polystyrene referenced weight average molecular weight of the component (A) determined by gel permeation chromatography (GPC) is typically within a range from 3,000 to 1,000,000, and preferably from 10,000 to 100,000, as this ensures that the polymer is a solid or semisolid, and provides favorable levels of workability and curability.

This type of organopolysiloxane having a resin structure can be synthesized, for example, by combining the compounds that act as the raw materials for each of the units, in quantities that enable the three siloxane units to be formed within the product polymer in the required molar ratio described above, and then conducting a cohydrolysis-condensation in the presence of an acid catalyst.

Examples of suitable raw materials for the $R^1SiO_{1.5}$ units include chlorosilanes such as $MeSiCl_3$, $EtSiCl_3$, $PhSiCl_3$, propyltrichlorosilane and cyclohexyltrichlorosilane, and the alkoxysilanes such as methoxysilanes that correspond with each of these chlorosilanes.

Examples of the raw material for the $R^2_2SiO$ units include the structures shown below.

-continued (wherein, m represents an integer from 5 to 50 (an average value), and n represents an integer from 0 to 50 (an average value))

Furthermore, the $R_a^3R_b^4SiO_{(4-a-b)/2}$ units represent any suitable combination of one or more siloxane units selected from amongst $R^3R^4SiO$ units, $R^2{}_3R^4SiO_{0.5}$ units, $R^2{}_4SiO$ units, and $R^3R^2{}_4SiO_{0.5}$ units. The raw materials for these units include chlorosilanes such as $Me_2ViSiCl$, $MeViSiCl_2$, $Ph_2ViSiCl$ and $PhViSiCl_2$, and alkoxysilanes such as methoxysilanes that correspond with each of these chlorosilanes.

In the present invention, during production of the organopolysiloxane of the component (A) by cohydrolysis and condensation of the raw materials described above, the $R^1SiO_{1.5}$ units, $R^2{}_2SiO$ units and/or $R_a^3R_b^4SiO_{(4-a-b)/2}$ units include siloxane units that contain a silanol group. The organopolysiloxane of the component (A) typically comprises not more than 10 mol % (namely, from 0 to 10 mol %), and preferably not more than 5 mol % (namely, 0 to 5 mol %) of these silanol group-containing siloxane units relative to the combined total of all the siloxane units. Examples of the silanol group-containing siloxane units include $R^1(HO)SiO$ units, $R^1(HO)_2SiO_{0.5}$ units, and $R^2{}_2(HO)SiO_{0.5}$ units.

—(B) Organohydrogenpolysiloxane Having Resin Structure—

The organohydrogenpolysiloxane having a resin structure (namely, a three dimensional network-type structure) of the component (B), which represents one of the important components of the composition of the present invention, is composed of $R^1SiO_{1.5}$ units, $R^2{}_2SiO$ units and $R_c^3H_dSiO_{(4-c-d)/2}$ units (wherein, $R^1$, $R^2$ and $R^3$ are as defined above, c represents 0, 1 or 2, and d represents 1 or 2, provided that c+d is 2 or 3), and includes a partial straight-chain siloxane structure in which at least a portion of the $R^2{}_2SiO$ units are connected in a continuous repeating sequence and the number of units in the repeating sequence is within a range from 5 to 50, preferably from 8 to 30, and even more preferably from 10 to 20.

In a similar manner to that described for the component (A), the partial structure in which at least a portion of the $R^2{}_2SiO$ units are connected in a continuous repeating sequence, and in which the number of units in the repeating sequence is within a range from 5 to 50, refers to a structure in which at least a portion of the $R^2{}_2SiO$ units, and preferably 50 mol % or greater (namely, 50 to 100 mol %) and even more preferably 80 mol % or greater (namely, 80 to 100 mol %) of the $R^2{}_2SiO$ units within the component (B) form a straight-chain diorganopolysiloxane chain structure represented by the above general formula (1) within the organohydrogenpolysiloxane molecule of the component (B).

In a molecule of the component (B), the presence of the $R^2{}_2SiO$ units causes the polymer molecule to extend in a straight-chain type structure, whereas the $R^1SiO_{1.5}$ units cause branching of the polymer molecule, or the formation of a three dimensional network structure. The hydrogen atoms bonded to silicon atoms within the $R_c^3H_dSiO_{(4-c-d)/2}$ units perform the role of curing the composition of the present invention by undergoing a hydrosilylation addition reaction with the alkenyl groups within the component (A).

The molar ratio between the three essential siloxane units that constitute the component (B), namely the molar ratio of $R^1SiO_{1.5}$ units:$R^2{}_2SiO$ units:$R_c^3H_dSiO_{(4-c-d)/2}$ units is preferably within a range from 90 to 24:75 to 9:50 to 1, and is even more preferably within a range from 70 to 28:70 to 20:10 to 2 (provided the total is 100), as such a ratio yields more favorable properties for the resulting cured product.

The polystyrene referenced weight average molecular weight of the component (B) determined by GPC is typically within a range from 3,000 to 1,000,000, and preferably from 10,000 to 100,000, as this provides more favorable levels of workability and curability.

This type of organohydrogenpolysiloxane having a resin structure can be synthesized, for example, by combining the compounds that act as the raw materials for each of the units, in quantities that enable the three siloxane units to be formed within the product polymer in the required molar ratio described above, and then conducting a cohydrolysis-condensation.

Examples of suitable raw materials for the $R^1SiO_{1.5}$ units include chlorosilanes such as $MeSiCl_3$, $EtSiCl_3$, $PhSiCl_3$, propyltrichlorosilane and cyclohexyltrichlorosilane, and the alkoxysilanes such as methoxysilanes that correspond with each of these chlorosilanes.

Examples of the raw material for the $R^2{}_2SiO$ units include the structures shown below.

-continued (wherein, m represents an integer from 5 to 50 (an average value), and n represents an integer from 0 to 50 (an average value))

Furthermore, the $R_c^3H_dSiO_{(4-c-d)/2}$ units represent any suitable combination of one or more siloxane units selected from amongst $R^3HSiO$ units, $R^2_3HSiO_{0.5}$ units, $H_2SiO$ units, and $R^3H_2SiO_{0.5}$ units. The raw materials for these units include chlorosilanes such as $Me_2HSiCl$, $MeHSiCl_2$, $Ph_2HSiCl$ and $PhHSiCl_2$, and alkoxysilanes such as methoxysilanes that correspond with each of these chlorosilanes.

In the present invention, during production of the organohydrogenpolysiloxane of the component (B) by cohydrolysis and condensation of the raw materials described above, the $R^1SiO_{1.5}$ units, $R^2_2SiO$ units and/or $R_c^3H_dSiO_{(4-c-d)/2}$ units include siloxane units that contain a silanol group. The organohydrogenpolysiloxane of the component (B) typically comprises not more than 10 mol % (namely, from 0 to 10 mol %), and preferably not more than 5 mol % (namely, 0 to 5 mol %) of these silanol group-containing siloxane units relative to the combined total of all the siloxane units. Examples of the silanol group-containing siloxane units include $R^1(HO)SiO$ units, $R^1(HO)_2SiO_{0.5}$ units, and $R^2_2(HO)SiO_{0.5}$ units.

The blend quantity of the organohydrogenpolysiloxane of the component (B) is sufficient that the molar ratio of hydrogen atoms bonded to silicon atoms (SiH groups) within the component (B) relative to the combined total of vinyl groups and allyl groups within the component (A) is typically within a range from 0.1 to 4.0, preferably from 0.5 to 3.0, and even more preferably from 0.8 to 2.0. If this ratio is less than 0.1, then the curing reaction proceeds poorly, and achieving a silicone cured product becomes difficult, whereas if the ratio exceeds 4.0, then a large quantity of unreacted SiH groups remains within the cured product, which can cause changes in the properties of the cured product over time.

In the present invention, in order to ensure more favorable adhesion, either one of, or both, the component (A) and the component (B) preferably contain silanol groups. The quantity of these silanol groups within the organopolysiloxane of the component (A) or the organohydrogenpolysiloxane of the component (B) is typically within a range from 0.01 to 0.3 mols/100 g, and is preferably from 0.05 to 0.2 mols/100 g. If the silanol group content is too high, then the change in hardness following curing is excessive, which is undesirable. In contrast, if the silanol group content is to low, then satisfactory adhesion may not be obtained.

—(C) Platinum Group Metal-based Catalyst—

This catalyst component is added to accelerate the addition curing reaction within the composition of the present invention, and is typically a platinum-based, palladium-based, or rhodium-based catalyst. Any of the conventional catalysts used for accelerating hydrosilylation reactions may be used as the catalyst. From the viewpoint of cost, platinum-based catalysts such as platinum, platinum black, chloroplatinic acid and platinum compounds such as $H_2PtCl_6.mH_2O$, $K_2PtCl_6$, $KHPtCl_6.mH_2O$, $K_2PtCl_4$, $K_2PtCl_4.mH_2O$ and $PtO_2.mH_2O$ (wherein, m represents a positive integer), as well as complexes of these compounds with hydrocarbons such as olefins, alcohols, or vinyl group-containing organopolysiloxanes are preferred. These catalysts may be used either alone, or in combinations of two or more different catalysts.

The blend quantity of the component (C) need only be sufficient to ensure effective curing, and a typical quantity, calculated as a mass of the platinum group metal relative to the combined mass of the components (A) and (B), is within a range from 0.1 to 500 ppm, and is preferably from 0.5 to 100 ppm.

—(D) Phosphor—

The phosphor of the component (D) may use any conventional phosphor, and the blend quantity of the phosphor is typically within a range from 0.1 to 100 parts by mass, and preferably from 1 to 80 parts by mass, per 100 parts by mass of the combination of the components (A) through (C). The particle size range for the phosphor of the component (D), measured, for example, with a Cilas Laser measurement apparatus or the like using a particle size distribution measurement based on a laser light diffraction method, is typically 10 nm or greater, and is preferably within a range from 10 nm to 10 μm, and even more preferably from 10 nm to 1 μm.

The fluorescent material may be any material which, for example, absorbs the light emitted from a semiconductor light emitting diode that employs a nitride-based semiconductor as the light emitting layer, and performs a wavelength conversion that alters the wavelength of the light to a different wavelength. For example, one or more materials selected from amongst nitride-based phosphors or oxynitride-based phosphors activated mainly with lanthanoid elements such as Eu or Ce, alkaline earth halogen apatite phosphors, alkaline earth metal halogen borate phosphors, alkaline earth metal aluminate phosphors, alkaline earth silicate phosphors, alkaline earth sulfide phosphors, alkaline earth thiogallate phosphors, alkaline earth silicon nitride phosphors and germanate phosphors activated mainly with lanthanoid elements such as Eu or transition metal elements such as Mn, rare earth aluminate phosphors and rare earth silicate phosphors activated mainly with lanthanoid elements such as Ce, organic or organic complex phosphors activated mainly with lanthanoid elements such as Eu, and Ca—Al—Si—C—N based oxynitride glass phosphors are preferred. Specifically, the phosphors listed below can be used, although the following is not a restrictive list.

Examples of nitride-based phosphors activated mainly with lanthanoid elements such as Eu or Ce include $M_2Si_5N_8$:Eu (wherein, M is at least one element selected from Sr, Ca, Ba, Mg and Zn). Furthermore, other examples in addition to $M_2Si_5N_8$:Eu include $MSi_7N_{10}$:Eu, $M_{1.8}Si_5O_{0.2}N_8$:Eu, and $M_{0.9}Si_7O_{0.1}N_{10}$:Eu (wherein, M is at least one element selected from Sr, Ca, Ba, Mg and Zn).

Examples of oxynitride-based phosphors activated mainly with lanthanoid elements such as Eu or Ce include $MSi_2O_2N_2$:EU (wherein, M is at least one element selected from Sr, Ca, Ba, Mg and Zn).

Examples of alkaline earth halogen apatite phosphors activated mainly with lanthanoid elements such as Eu or transition metal elements such as Mn include $M_5(PO_4)_3X$:R (wherein, M represents at least one element selected from Sr, Ca, Ba, Mg and Zn, X represents at least one selected from F, Cl, Br and I, and R represents at least one of Eu, Mn, and a combination of Eu and Mn).

Examples of alkaline earth metal halogen borate phosphors include $M_2B_5O_9X$:R (wherein, M represents at least one element selected from Sr, Ca, Ba, Mg and Zn, X represents at least one element selected from F, Cl, Br and I, and R represents at least one of Eu, Mn, and a combination of Eu and Mn).

Examples of alkaline earth metal aluminate phosphors include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (wherein, R represents at least one of Eu, Mn, and a combination of Eu and Mn).

Examples of alkaline earth sulfide phosphors include $La_2O_2S$:Eu, $Y_2O_2S$:Eu, and $Gd_2O_2S$:Eu.

Examples of rare earth aluminate phosphors activated mainly with lanthanoid elements such as Ce include YAG phosphors represented by compositional formulas such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$. Furthermore, other examples include phosphors such as $Tb_3Al_5O_{12}$:Ce and $Lu_3Al_5O_{12}$:Ce in which a portion of, or all of, the Y has been replaced with Tb or Lu or the like.

Examples of other phosphors include ZnS:Eu, $Zn_2GeO_4$:Mn and $MGa_2S_4$:Eu (wherein, M represents at least one element selected from Sr, Ca, Ba, Mg and Zn).

The above phosphors may also comprise one or more elements selected from Tb, Cu, Ag, Au, Cr, Nd, Dy, Co, Ni and Ti, either instead of Eu or in addition to Eu.

Ca—Al—Si—O—N based oxynitride glass phosphors describe phosphors in which the matrix material is an oxynitride glass comprising from 20 to 50 mol % of $CaCO_3$ calculated as CaO, from 0 to 30 mol % of $Al_2O_3$, from 25 to 60 mol % of SiO, from 5 to 50 mol % of AlN, and from 0.1 to 20 mol % of rare earth oxides or transition metal oxides, provided that the combination of these five materials totals 100 mol % In a phosphor that employs an oxynitride glass as the matrix material, the nitrogen content is preferably not higher than 15% by mass, and in addition to the rare earth oxide ions, another rare earth element ion that functions as a sensitizer is preferably included within the phosphor glass in the form of a rare earth oxide in a quantity within a range from 0.1 to 10 mol % so as to function as a co-activator.

Furthermore, other phosphors that offer similar performance and effects to the phosphors listed above can also be used.

—Other Additives—

In addition to the components (A) through (D) described above, the composition of the present invention may also include various conventional additives as required.

Inorganic Fillers:

Examples of inorganic fillers include reinforcing inorganic fillers such as fumed silica and fumed titanium dioxide, and non-reinforcing inorganic fillers such as calcium carbonate, calcium silicate, titanium dioxide, ferric oxide, carbon black and zinc oxide. These inorganic fillers may be added to the composition in quantities totaling not more than 600 parts by mass (namely, from 0 to 600 parts by mass) per 100 parts by mass of the combination of components (A) and (B).

Adhesion Assistants

Furthermore, in order to impart adhesiveness to the composition of the present invention, an adhesion assistant may be added as required. Examples of adhesion assistants include straight-chain or cyclic organosiloxane oligomers of 4 to 50 silicon atoms, and preferably 4 to 20 silicon atoms, comprising at least two, and preferably either two or three, functional groups selected from the group consisting of a hydrogen atom bonded to a silicon atom (SiH group), an alkenyl group bonded to a silicon atom (such, as a Si—CH=$CH_2$ group), an alkoxysilyl group (such as a trimethoxysilyl group) and an epoxy group (such as a glycidoxypropyl group or 3,4-epoxy-cyclohexylethyl group) within each molecule; and organooxysilyl-modified isocyanurate compounds represented by a general formula (2) shown below and/or hydrolysis-condensation products thereof (organosiloxane-modified isocyanurate compounds).

(2)

[wherein, $R^5$ represents an organic group represented by a formula (3) shown below:

(3)

(wherein, $R^6$ represents a hydrogen atom or a monovalent hydrocarbon group of 1 to 6 carbon atoms, and v represents an integer from 1 to 6, and preferably from 1 to 4), or a monovalent hydrocarbon group comprising an aliphatic unsaturated bond, provided that at least one of the $R^5$ groups is an organic group of the formula (3)]

Examples of the monovalent hydrocarbon group comprising an aliphatic unsaturated bond represented by $R^5$ in the above general formula (2) include alkenyl groups of 2 to 8, and preferably 2 to 6 carbon atoms, such as a vinyl group, allyl group, propenyl group, isopropenyl group, butenyl group, isobutenyl group, pentenyl group or hexenyl group, and cycloalkenyl groups of 6 to 8 carbon atoms such as a cyclohexenyl group. Furthermore, examples of the mohovalent hydrocarbon group represented by $R^6$ in the formula (3) include monovalent hydrocarbon groups of 1 to 8, and preferably 1 to 6 carbon atoms, including alkyl groups such as a methyl group, ethyl group, propyl group, isopropyl group, butyl group, isobutyl group, tert-butyl group, pentyl group, hexyl group or cyclohexyl group, the alkenyl groups and cycloalkenyl groups exemplified above for the $R^5$ group, and aryl groups such as a phenyl group. Of these, alkyl groups are preferred.

Specific examples of adhesion assistants include 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, and the compounds represented by the formulas shown below.

(wherein, g and h each represent a positive integer from 0 to 50, provided that g+h is within a range from 2 to 50, and preferably from 4 to 20)

Of the organosilicon compounds described above, organosilicon compounds having a silicon atom-bonded alkoxy group and an alkenyl group or silicon atom-bonded hydrogen atom (SiH group) within each molecule are preferred as they yield cured products with particularly superior adhesion.

The blend quantity of an adhesion assistant is typically not more than 10 parts by mass (namely, from 0 to 10 parts by mass), and is preferably from 0.1 to 8 parts by mass, and even more preferably from 0.2 to 5 parts by mass, per 100 parts by mass of the component (A). A blend quantity that is too large can have adverse effects on the hardness of the cured product, and may increase the surface tack.

If required, the silicone composition sheet of the present invention may also include an added liquid silicone component, provided the composition sheet retains its solid or semisolid state at room temperature and does not become a liquid. This type of liquid silicone component preferably has a viscosity at room temperature (25° C.) within a range from 1 to 100,000 mPa·s, and examples include vinylsiloxanes, hydrogensiloxanes, alkoxysiloxanes, hydroxysiloxanes, and mixtures thereof. The quantity added of such liquid silicone components is limited by the requirement that the silicone composition sheet remains a solid or semisolid at room temperature, and is typically not more than 50% by mass of the entire silicone composition sheet.

Curing Retarders

A curing inhibitor may be added to the composition of the present invention according to need. Examples of the curing retarder include organopolysiloxanes with a high vinyl group content such as tetramethyltetravinylcyclotetrasiloxane, triallyl isocyanurate, alkyl maleates, acetylene alcohols and silane-modified or siloxane-modified products thereof, hydroperoxides, tetramethylethylenediamine, benzotriazole, and mixtures of the above compounds. The curing retarder is typically added in a quantity within a range from 0.001 to 1.0 parts by mass, and preferably from 0.005 to 0.5 parts by mass, per 100 parts by mass of the component (A).

A composition that is essentially composed of the components (A) through (D) is described below as a typical example of the composition of the present invention. The expression "is essentially composed of the components (A) through (D)" means that besides the components (A) to (D), the composition may also include at least one of the optional components described above, provided such inclusion does not impair the objects or effects of the present invention.

—Preparation—

The silicone resin composition of the present invention is prepared by mixing the required components uniformly together. Typically, the composition is stored as two separate liquids to prevent curing from proceeding, with the two liquids then mixed and cured at the time of use. The composition may, of course, also be prepared as a one-pot composition by adding a small quantity of a curing retarder such as an acetylene alcohol.

[Adhesive Silicone Composition Sheet]

The composition sheet of the present invention is a sheet that is formed of the addition curable adhesive silicone composition described above, wherein the thickness of the sheet is typically within a range from 1 to 500 μm, and is preferably from 10 to 300 μm. This thickness can be used to appropriately adjust factors such as the phosphor content and the light emitting efficiency of the light emitting device.

The composition of the present invention is processed into sheet form, and for example, is then frozen for storage. When required, the sheet can be cured rapidly by heating, enabling the formation of a flexible cured resin layer with a high degree of hardness and no surface tack. Because the cured resin layer contains a phosphor, a phosphor layer that exhibits stable light conversion properties can be formed by forming the layer on top of the chip of a blue or ultraviolet LED element.

Examples of the technique used for processing the composition of the present invention into a sheet-like form include using a film coater or a hot-press machine. In one example of a method of processing the composition into a sheet-like form using one of these techniques, the composition is sandwiched between a pressurization base film and a release film, and a hot-press machine is then used to conduct compression molding at a temperature within a range from 60 to 120° C. and preferably from 70 to 100° C., under a pressure of 0.5 to 10 t/cm², and preferably 1 to 7 t/cm², for a period of approximately 1 to 30 minutes, and preferably 2 to 10 minutes.

Examples of the pressurization base film include PET films, fluororesin films, polyethylene films, and polypropylene films, whereas examples of the release film include fluororesin-coated PET films, silicone resin-coated PET films, and fluororesin films.

The composition sheet prepared in this manner is preferably such that if heat curing is conducted without including the phosphor of the component (D), then the resulting cured silicone resin layer exhibits a light transmittance in the region from 400 nm through to the visible light region of not less than 90%, and even more preferably 92% or greater.

[Method of Producing Light Emitting Device]

In a method of producing a light emitting device according to the present invention, the composition sheet described above is positioned on the surface of an LED chip, and the composition sheet is then heat-cured, thereby coating the surface of the LED chip with a phosphor-containing cured silicone resin layer. Not only the surface of the semiconductor chip, but the entire surface of the device besides the LED chip surface may also be coated with the silicone resin layer.

Specifically, the composition sheet is cut to the size of the area that is to be coated, whether that area be only the chip surface, or the entire surface of the LED element including the chip surface. In other words, for example, the composition sheet obtained in the manner described above is cut to the size of the chip with the laminated release film still attached to the sheet. The release film is then removed from the cut sample of the composition sheet, the sheet is positioned on top of the chip so as to make contact with the surface to be covered, the composition sheet sample on the chip surface is then heat-molded and cured, thereby forming a cured phosphor-containing silicone resin layer on the surface requiring coating, and the base film is then removed. The base film may also be removed in advance.

When the composition sheet sample is pressure bonded to the LED chip, or is heat-cured while also undergoing pressure bonding, the pressure bonding may be conducted using an apparatus such as a film bonder, and is typically conducted at a temperature within a range from room temperature to 300° C., and under a pressure of not more than 10 MPa (typically from 0.01 to 10 MPa), preferably not more than 5 MPa (for example, from 0.1 to 5 MPa), and even more preferably from 0.5 to 5 MPa.

Curing of the composition sheet of the present invention is typically conducted at a temperature within a range from 50 to 200° C., and preferably from 70 to 180° C., for a heating period of 1 to 30 minutes, and preferably approximately 2 to 10 minutes. Furthermore, secondary curing (post-curing) may also be conducted, and is typically conducted at a temperature within a range from 50 to 200° C., and preferably from 70 to 180° C., for a period of 0.1 to 10 hours, and preferably 1 to 4 hours. Secondary curing is usually conducted following primary curing.

EXAMPLES

Specifics of the present invention are described below based on a series of synthesis examples, examples and comparative examples, although the present invention is in no way limited by the examples presented below. Viscosity values in the following examples refer to values measured at 25° C. Furthermore, the weight average molecular weight values refer to values measured by gel permeation chromatography (GPC) and referenced against polystyrene standards. Ph represents a phenyl group, Me represents a methyl group, and Vi represents a vinyl group.

Synthesis Example 1

Vinyl Group-Containing Organopolysiloxane Resin (A1)

1142.1 g (87.1 mol %) of an organosilane represented by $PhSiCl_3$, 529 g (3.2 mol %) of $ClMe_2SiO(Me_2SiO)_{33}SiMe_2Cl$, and 84.6 g (9.7 mmol %) of $MeViSiCl_2$ were dissolved in toluene solvent, the solution was added dropwise to water to effect a cohydrolysis, the product was washed with water, neutralized by alkali washing, dewatered, and the solvent was then stripped, yielding a vinyl group-containing resin (A1). This resin A1 was a solid with a weight average molecular weight of 62,000 and a melting point of 60° C. The vinyl group content of the resin was 0.10 mol/100 g.

Synthesis Example 2

Hydrosilyl Group-Containing Organopolysiloxane Resin (B1)

1142.1 g (87.1 mmol %) of the organosilane represented by $PhSiCl_3$, 529 g (3.2 mol %) of $ClMe_2SiO(Me_2SiO)_{33}SiMe_2Cl$, and 69 g (9.7 mol %) of $MeHSiCl_2$ were dissolved in toluene solvent, the solution was added dropwise to water to effect a cohydrolysis, the product was washed with water, neutralized by alkali washing, dewatered, and the solvent was then stripped, yielding a hydrosilyl group-containing resin (B1). The hydrosilyl group content of the resin was 0.12 mol/100 g. This resin B1 was a solid with a weight average molecular weight of 58,000 and a melting point of 58° C.

Synthesis Example 3

Vinyl Group-Containing Organopolysiloxane Resin (A2)

1142.1 g (87.1 mol %) of the organosilane represented by $PhSiCl_3$, 529 g (3.2 mol %) of $ClMe_2SiO(Me_2SiO)_{33}SiMe_2Cl$, and 72.3 g (9.7 mol %) of $Me_2ViSiCl$ were dissolved in toluene solvent, the solution was added dropwise to water to effect a cohydrolysis, the product was washed with water, neutralized by alkali washing, dewatered, and the solvent was then stripped, yielding a vinyl group-containing resin (A2). The vinyl group content of the resin was 0.09 mol/100 g. This resin A2 was a solid with a weight average molecular weight of 63,000 and a melting point of 63° C.

Synthesis Example 4

Hydrosilyl Group-Containing Organopolysiloxane Resin (B2)

1142.1 g (87.1 mol %) of the organosilane represented by $PhSiCl_3$, 529 g (3.2 mol %) of $ClMe_2SiO(Me_2SiO)_{33}SiMe_2Cl$, and 56.7 g (9.7 mol %) of $Me_2HSiCl$ were dissolved in toluene solvent, the solution was added dropwise to water to effect a cohydrolysis, the product was washed with water, neutralized by alkali washing, dewatered, and the solvent was then stripped, yielding a hydrosilyl group-containing resin (B2). The hydrosilyl group content of the resin was 0.11 mol/100 g. This resin B2 was a solid with a weight average molecular weight of 57,000 and a melting point of 56° C.

Example 1

A base composition was prepared by combining 189 g of the vinyl group-containing resin (A1) obtained in the synthesis example 1, 189 g of the hydrosilyl group-containing resin (B1) obtained in the synthesis example 2, 0.2 g of the acetylene alcohol-based compound ethynylcyclohexanol as a reaction retarder, and 0.1 g of an octyl alcohol-modified solution of chloroplatinic acid. To 90 parts by mass of this base composition was added 10 parts by mass of a phosphor (YAG) with a particle size of 5 μm (average particle size), and the resulting mixture was mixed thoroughly in a planetary mixer heated at 60° C., thereby yielding a phosphor-containing silicone resin composition. This composition was a plastic-like solid at 25° C.

The composition obtained in this manner was evaluated by conducting the following measurements.

1) Chromaticity Measurement

Figure 1:
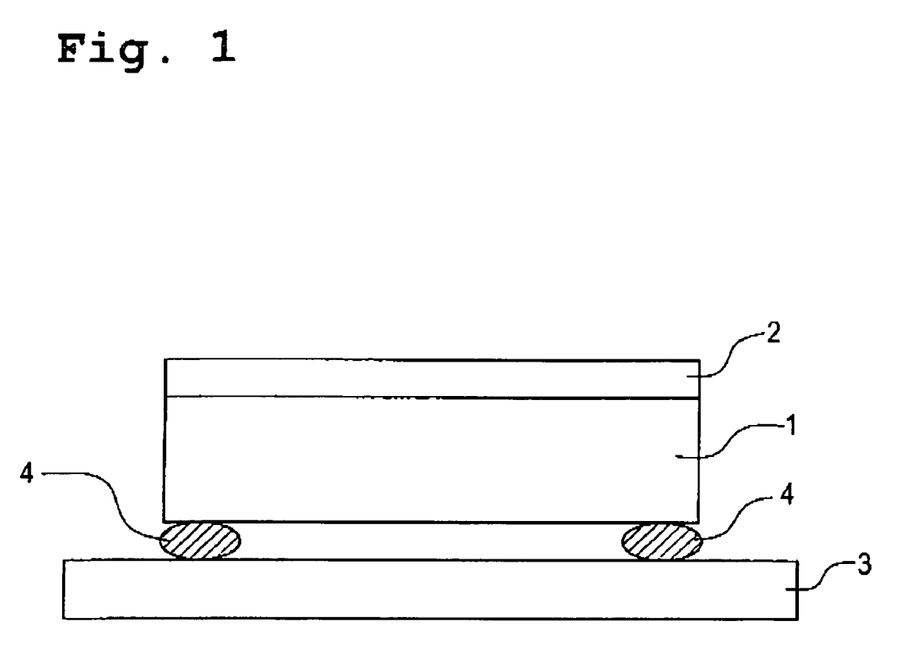
FIG. 1 is a schematic representation showing a light emitting semiconductor (LED) device with a flip-chip structure, prepared for measuring the chromaticity values in the examples.

The composition was sandwiched between a PET film (a pressurization base film) and a fluororesin-coated PET film (a release film), and compression molding was then conducted using a hot press machine at 80° C., under a pressure of 5 t/cm², and for a period of 5 minutes, thereby molding a film-like product with a thickness of 50 μm. The resulting composition film was cut to the size of the semiconductor chip while still in a laminated state that included the release film. As shown in FIG. 1, the cut laminated film sample was placed on an LED GaN-based semiconductor chip 1 so that the composition layer made contact with the surface of the chip, and the release film (not shown in the FIGURE) was then removed from the composition layer. Subsequently, a film bonder was used to conduct thermocompression bonding at 150° C. and 0.5 MPa for a period of 5 minutes, thereby forming a cured phosphor-containing silicone resin layer 2 on top of the LED chip 1. This resin layer was then subjected to secondary curing by heating at 150° C. for 60 minutes. Using the thus prepared LED chip 1 coated with the phosphor-containing silicone resin layer 2, a light emitting semiconductor (LED) device with a flip-chip structure such as that shown in FIG. 1 was prepared on top of a ceramic circuit substrate 3. In the FIGURE, numeral 4 represents a solder ball. Three of these LED devices were activated, and the chromaticity was measured using an LP-3400 apparatus manufactured by Otsuka Electronics Co., Ltd.

2) Mechanical Properties

Compression molding of the composition was conducted using a compression molding device, with heat-molding conducted at 150° C. for 5 minutes to yield a cured product. This cured product was then subjected to secondary curing at 150° C. for 4 hours, and the resulting product was measured for tensile strength (0.2 mm thickness), hardness (measured using a type D spring tester), and elongation (0.2 mm thickness) in accordance with JIS K 6251 and JIS K 6253.

3) Surface Tack

The tack of the surface of a cured product, obtained by conducting secondary curing in the same manner as that described above for measuring the mechanical properties, was ascertained by finger touch. In addition, the cured product was placed in a sample of commercially available silver powder (average particle size: 5 μm), and following removal from the powder, the product was blown with air to test whether the silver powder that had adhered to the surface like dust could be removed.

4) Dispersion Stability of Phosphor

A depression with a diameter of 6 mm and a central depth of 2 mm formed in an alumina base was filled with the resin composition immediately following preparation in the manner described above, and heat-curing was then conducted under the same conditions as those described above for evaluating the mechanical properties, yielding a disc-shaped cured product with a thickness of 2 mm and a diameter of 6 mm. Samples were cut from the upper surface layer (a layer part with a thickness of 0.5 mm on the upper surface) and the lower surface layer (a layer part with a thickness of 0.5 mm on the lower surface), each sample was ashed by heating to 800° C., the quantity (mass %) of phosphor within each ash sample was measured, and the quantities of phosphor within the upper portion and the lower portion were compared.

Moreover, a sample of the composition was also stored in a freezer at −20° C. for 3 months, and the composition was then molded in the same manner as described above, and the quantities of phosphor within the upper portion and lower portion were compared in the same manner as described above. This method was used to measure the dispersion stability of the phosphor.

These measurement results are shown in Table 1.

Example 2

A base composition was prepared by combining 189 g of the vinyl group-containing resin (A2) obtained in the synthesis example 3, 189 g of the hydrosilyl group-containing resin (B2) obtained in the synthesis example 4, 0.2 g of the acetylene alcohol-based compound ethynylcyclohexanol as a reaction retarder, and 0.1 g of an octyl alcohol-modified solution of chloroplatinic acid. To 70 parts by mass of this base composition was added 30 parts by mass of a phosphor (YAG) with a particle size of 5 μm (average particle size), and the resulting mixture was mixed thoroughly in a planetary mixer heated at 60° C., thereby yielding a phosphor-containing silicone resin composition. This composition was a plastic-like solid at 25° C. The composition was evaluated in the same manner as the example 1. The results are shown in Table 1.

Comparative Example 1

With the exception of replacing the 90 parts by mass of the base composition from the example 1 with 90 parts by mass of a commercially available addition reaction-curable silicone varnish KJR-632 (a product name, manufactured by Shin-Etsu Chemical Co., Ltd.) that contains a vinyl group-containing organopolysiloxane resin that is a liquid at room temperature as the main component, a phosphor-containing silicone resin composition was prepared in the same manner as the example 1. The properties of this composition were evaluated using the same methods as those described for the example 1. The results are shown in Table 1.

Comparative Example 2

The base composition from the example 1 was replaced with a commercially available addition reaction-curable silicone varnish KJR-632L-1 (a product name, manufactured by Shin-Etsu Chemical Co., Ltd.) that contains a vinyl group-containing organopolysiloxane resin that is a liquid at room temperature as the main component. To 70 parts by mass of this KJR-632L-1 was added 30 parts by mass of the same phosphor (YAG) of particle size of 5 μm (average particle size) used in the example 1, and the resulting mixture was mixed thoroughly in a planetary mixer heated at 60° C., yielding a phosphor-containing silicone resin composition. The properties of this composition were evaluated using the same methods as those described for the example 1. The results are shown in Table 1.

TABLE 1

| | | Example 1 | | Example 2 | | Comparative example 1 | | Comparative example 2 | |
|---|---|---|---|---|---|---|---|---|---|
| SiH/SiVi (*1) | | 1.0 | | 1.0 | | 1.0 | | 1.0 | |
| Secondary curing conditions | | 150° C. × 4 hr | | 150° C. × 4 hr | | 150° C. × 4 hr | | 150° C. × 4 hr | |
| Chromaticity | n | x | y | x | y | x | y | x | y |
| | 1 | 0.310 | 0.310 | 0.310 | 0.310 | 0.310 | 0.315 | 0.312 | 0.315 |
| | 2 | 0.311 | 0.310 | 0.310 | 0.310 | 0.305 | 0.321 | 0.314 | 0.310 |
| | 3 | 0.310 | 0.310 | 0.310 | 0.310 | 0.310 | 0.316 | 0.310 | 0.322 |
| Hardness (type D) | | 55 | | 60 | | 75 | | 80 | |
| Elongation (%) | | 15 | | 15 | | 0 | | 0 | |
| Tensile strength (MPa) | | 8 | | 8 | | 1 | | 1 | |
| Silver powder adhesion caused by surface tack | | None | | None | | None | | None | |
| Phosphor content (immediately after preparation) Upper portion:Lower portion (mass %) | | Upper 10: lower 10 (no variation) | | Upper 30: lower 30 (no variation) | | Upper 8: lower 11 | | Upper 26: lower 33 | |
| Phosphor content (3 months after preparation) Upper portion:Lower portion (mass %) | | Upper 10: lower 10 (no variation) | | Upper 30: lower 30 (no variation) | | Upper 2: lower 18 | | Upper 3: lower 50 | |

(Notes)
(*1) The molar ratio of silicon atom-bonded hydrogen atoms within the hydrosilyl group-containing resin relative to silicon atom-bonded vinyl groups within the vinyl group-containing resin.

What is claimed is:

1. An addition curable adhesive silicone resin composition that is a solid or semisolid at room temperature, comprising:
   (A) an organopolysiloxane having a resin structure composed of $R^1SiO_{1.5}$ units, $R^2{}_2SiO$ units and $R^3{}_aR^4{}_bSiO_{(4-a-b)/2}$ units (wherein, $R^1$, $R^2$ and $R^3$ each represent, independently, a hydroxyl group, methyl group, ethyl group, propyl group, cyclohexyl group or phenyl group, each $R^4$ represents, independently, a vinyl group or allyl group, a represents 0, 1 or 2, and b represents 1 or 2, provided that a+b is 2 or 3), in which at least a portion of the $R^2{}_2SiO$ units are connected in a continuous repeating sequence, and a number of units in the repeating sequence is within a range from 5 to 50,
   (B) an organohydrogenpolysiloxane having a resin structure composed of $R^1SiO_{1.5}$ units, $R^2{}_2SiO$ units and $R^3{}_cH_dSiO_{(4-c-d)/2}$ units (wherein, $R^1$, $R^2$ and $R^3$ are as defined above, c represents 0, 1 or 2, and d represents 1 or 2, provided that c+d is 2 or 3), in which at least a portion of the $R^2{}_2SiO$ units are connected in a continuous repeating sequence, and a number of units in the repeating sequence is within a range from 5 to 50, the organohydrogenpolysiloxane provided in sufficient quantity that a molar ratio of hydrogen atoms bonded to silicon atoms within component (B) relative to a combined total of vinyl groups and allyl groups within component (A) is within a range from 0.1 to 4.0,
   (C) an effective curing quantity of a platinum group metal-based catalyst, and
   (D) a phosphor.

2. The adhesive silicone composition according to claim 1, wherein either one of, or both, component (A) and component (B) contain a silanol group.

3. The adhesive silicone composition according to claim 1, comprising from 0.1 to 100 parts by mass of the phosphor of component (D) per 100 parts by mass of a combined total of components (A) through (C).

4. The adhesive silicone composition according to claim 1, wherein a particle size of the phosphor of component (D) is 10 nm or greater.

5. An adhesive silicone composition sheet prepared by molding a composition that is a solid or semisolid at room temperature, comprising:
   (A) an organopolysiloxane having a resin structure composed of $R^1SiO_{1.5}$ units, $R^2{}_2SiO$ units and $R^3{}_aR^4{}_bSiO_{(4-a-b)/2}$ units (wherein, $R^1$, $R^2$ and $R^3$ each represent, independently, a hydroxyl group, methyl group, ethyl group, propyl group, cyclohexyl group or phenyl group, each $R^4$ represents, independently, a vinyl group or allyl group, a represents 0, 1 or 2, and b represents 1 or 2, provided that a+b is 2 or 3), in which at least a portion of the $R^2{}_2SiO$ units are connected in a continuous repeating sequence, and a number of units in the repeating sequence is within a range from 5 to 50,
   (B) an organohydrogenpolysiloxane having a resin structure composed of $R^1SiO_{1.5}$ units $R^2{}_2SiO$ units and $R^3{}_cH_dSiO_{(4-c-d)/2}$ units (wherein, $R^1$, $R^2$ and $R^3$ are as defined above, c represents 0, 1 or 2 and d represents 1 or 2, provided that c+d is 2 or 3), in which at least a portion of the $R^2{}_2SiO$ units are connected in a continuous repeating sequence, and a number of units in the repeating sequence is within a range from 5 to 50, the organohydrogenpolysiloxane provided in sufficient quantity that a molar ratio of hydrogen atoms bonded to silicon atoms within component (B) relative to a combined total of vinyl groups and allyl groups within component (A) is within a range from 0.1 to 4.0,
   (C) an effective curing quantity of a platinum group metal-based catalyst, and
   (D) a phosphor into a sheet-like form.

6. A method of producing a light emitting device having a coated LED chip, the method comprising:
   positioning an adhesive silicone composition sheet prepared by molding a composition that is a solid or semisolid at room temperature, comprising:
   (A) an organopolysiloxane having a resin structure composed of $R^1SiO_{1.5}$ units, $R^2{}_2SiO$ units and $R^3{}_aR^4{}_bSiO_{(4-a-b)/2}$ units (wherein, $R^1$, $R^2$ and $R^3$ each represent, independently, a hydroxyl group, methyl group, ethyl group, propyl group, cyclohexyl group or phenyl group, each $R^4$ represents, independently, a vinyl group or allyl group, a represents 0, 1 or 2, and b represents 1 or 2, provided that a+b is 2 or 3 in which at least a portion of the $R^2{}_2SiO$ units are connected in a continuous repeating sequence, and a number of units in the repeating sequence is within a range from 5 to 50,
   (B) an organohydrogenpolysiloxane having a resin structure composed of $R^1SiO_{1.5}$ units $R^2{}_2SiO$ units and $R^3{}_cH_dSiO_{(4-c-d)/2}$ units (wherein, $R^1$, $R^2$ and $R^3$ are as defined above, c represents 0, 1 or 2, and d represents 1 or 2, provided that c+d is 2 or 3), in which at least a portion of the $R^2{}_2SiO$ units are connected in a continuous repeating sequence, and a number of units in the repeating sequence is within a range from 5 to 50, the organohydrogenpolysiloxane provided in sufficient quantity that a molar ratio of hydrogen atoms bonded to silicon atoms within component (B) relative to a combined total of vinyl groups and allyl groups within component (A) is within a range from 0.1 to 4.0,
   (C) an effective curing quantity of a platinum group metal-based catalyst, and
   (D) a phosphor into a sheet-like form on a surface of an LED chip; and
   heat-curing the composition sheet, thereby coating the surface of the LED chip with a phosphor-containing cured silicone resin layer.

7. A light emitting device having a coated LED chip, obtainable using a method comprising:
   positioning an adhesive silicone composition sheet prepared by molding a composition that is a solid or semisolid at room temperature, comprising:
   (A) an organopolysiloxane having a resin structure composed of $R^1SiO_{1.5}$ units, $R^2{}_2SiO$ units and $R^3{}_aR^4{}_bSiO_{(4-a-b)/2}$ units (wherein, $R^1$, $R^2$ and $R^3$ each represent, independently, a hydroxyl group, methyl group, ethyl group, propyl group, cyclohexyl group or phenyl group, each $R^4$ represents, independently, a vinyl group or allyl group, a represents 0, 1 or 2, and b represents 1 or 2, provided that a+b is 2 or 3), in which at least a portion of the $R^2{}_2SiO$ units are connected in a continuous repeating sequence, and a number of units in the repeating sequence is within a range from 5 to 50,
   (B) an organohydrogenpolysiloxane having a resin structure composed of $R^1SiO_{1.5}$ units, $R^2{}_2SiO$ units and $R^3{}_cH_dSiO_{(4-c-d)/2}$ units (wherein, $R^1$, $R^2$ and $R^3$ are as defined above, c represents 0, 1 or 2 and d represents 1 or 2, provided that c+d is 2 or 3), in which at least a portion of the $R^2{}_2SiO$ units are connected in a continuous repeating sequence, and a number of units in the repeating sequence is within a range from 5 to 50, the organohydrogenpolysiloxane provided in sufficient quantity that a molar ratio of hydrogen atoms bonded to silicon atoms within component (B) relative to a combined total of vinyl groups and allyl groups within component (A) is within a range from 0.1 to 4.0,
(C) an effective curing quantity of a platinum group metal-based catalyst, and
(D) a phosphor into a sheet-like form on a surface of an LED chip; and
heat-curing the composition sheet, thereby coating the surface of the LED chip with a phosphor-containing red silicone resin layer.

* * * * *